United States Patent
Ohara

(10) Patent No.: US 7,528,748 B2
(45) Date of Patent: May 5, 2009

(54) SERIAL DATA RECEIVING CIRCUIT AND SERIAL DATA RECEIVING METHOD

(75) Inventor: Kunihiro Ohara, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/939,286

(22) Filed: Nov. 13, 2007

(65) Prior Publication Data

US 2008/0111715 A1    May 15, 2008

(30) Foreign Application Priority Data

Nov. 15, 2006    (JP) .............................. 2006-309440

(51) Int. Cl.
    *H03M 9/00*    (2006.01)
(52) U.S. Cl. ...................................... 341/101; 341/100
(58) Field of Classification Search ................ 341/100, 341/101, 50; 375/355, 368
    See application file for complete search history.

(56) References Cited

U.S. PATENT DOCUMENTS

| | | | |
|---|---|---|---|
| 3,836,908 A | * | 9/1974 | Hegendorfer ................ 341/152 |
| 5,661,846 A | * | 8/1997 | Lee .............................. 386/68 |
| 5,774,084 A | * | 6/1998 | Brombaugh et al. ........ 341/152 |
| 5,914,953 A | * | 6/1999 | Krause et al. ............... 370/392 |
| 5,987,038 A | * | 11/1999 | Staszewski et al. ......... 370/514 |

FOREIGN PATENT DOCUMENTS

| | | |
|---|---|---|
| JP | 07-221749 | 8/1995 |
| JP | 08-307405 | 11/1996 |
| JP | 09-055728 | 2/1997 |
| JP | 10-304014 | 11/1998 |
| JP | 11-145944 | 5/1999 |
| JP | 2001-036514 | 2/2001 |
| JP | 2001-308719 | 11/2001 |

* cited by examiner

Primary Examiner—Peguy Jean Pierre
(74) Attorney, Agent, or Firm—Arent Fox LLP

(57) ABSTRACT

A serial data receiving circuit and a serial data receiving method are provided which are capable of performing inter-conversion on bit sequences of data bit groups, between LSB first and MSB first, in serial data transmitted serially in successive data bit groups. Conversion parts C1 through C8 receive 8 different bit strings BS1 through BS8 having a 32-bit bit length and in which a start position of a head bit is shifted by one bit at a time. Conversion parts C1 through C8 perform a conversion operation to reverse a bit sequence of the bit strings BS1 through BS8 every 8 bits starting from a head bit. Coincidence detection circuits D1 through D8 perform coincidence detection on the bit strings BS1 through BS8 to detect coincidence with a synchronization pattern RS. A selector circuit 60 extracts any of upper bit strings HCBS1 through HCBS8 from the bit strings on which coincidence detection was performed, and outputs the result as detection data FD.

12 Claims, 11 Drawing Sheets

CIRCUIT CONFIGURATION DIAGRAM OF SERIAL DATA RECEIVING CIRCUIT 1

FIG. 1 CIRCUIT CONFIGURATION DIAGRAM OF SERIAL DATA RECEIVING CIRCUIT 1

FIG. 2 CIRCUIT CONFIGURATION DIAGRAM OF SYNCHRONIZATION CODE DETECTION CIRCUIT 4

FIG. 3  CIRCUIT CONFIGURATION DIAGRAM OF SELECTOR CIRCUIT 60

FIG. 4 FRAME FORMAT OF BIT STRINGS BS1 THROUGH BS8

FIG. 5  FRAME FORMAT OF CONVERSION PART C3

FIG. 6  TIMING CHART OF SERIAL DATA RECEIVING CIRCUIT 1

FIG. 7 CIRCUIT CONFIGURATION DIAGRAM OF SYNCHRONIZATION CODE DETECTION CIRCUIT 4a

FIG. 8 CIRCUIT CONFIGURATION DIAGRAM OF BIT SEQUENCE CONVERSION CIRCUIT 20b

FIG. 9 CIRCUIT CONFIGURATION DIAGRAM OF SYNCHRONIZATION CODE DETECTION CIRCUIT

CIRCUIT DIAGRAM OF CONVENTIONAL SERIAL DATA RECEIVING DEVICE

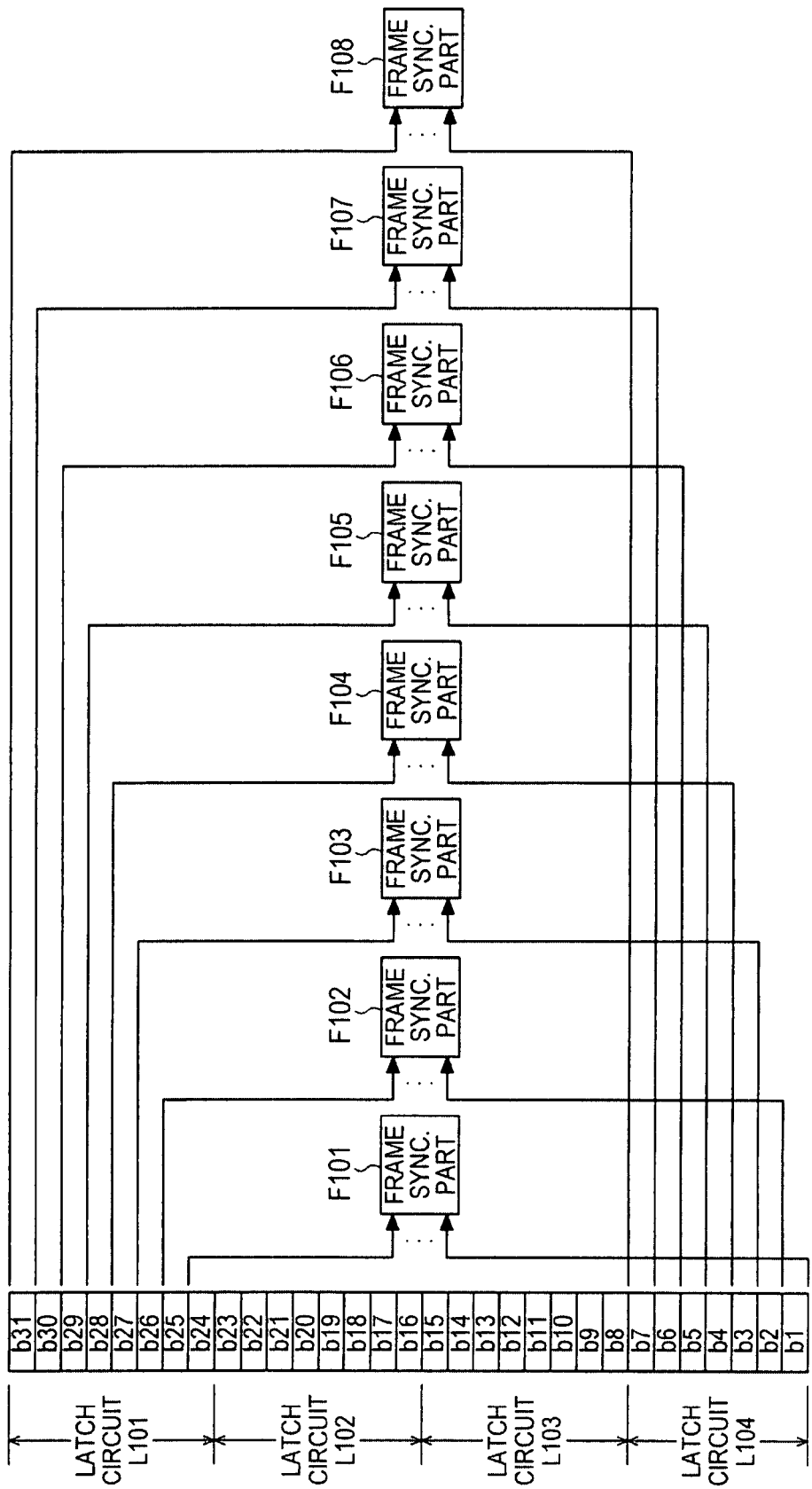
FIG. 11 (PRIOR ART) CIRCUIT DIAGRAM OF CONVENTIONAL LATCH CIRCUIT AND FRAME SYNCHRONIZATION PART

SERIAL DATA RECEIVING CIRCUIT AND SERIAL DATA RECEIVING METHOD

CROSS-REFERENCE TO RELATED APPLICATIONS

This application is based upon and claims the benefit of priority from each of the prior Japanese Patent application No. 2006-309440 filed on Nov. 15, 2006, the entire contents of which are incorporated herein by reference.

BACKGROUND

1. Field

The embodiment relates to a serial data receiving circuit and a serial data receiving method. More particularly, it relates to a serial data receiving circuit and a serial data receiving method capable of performing interconversion on a bit sequence of data bit groups, between LSB first and MSB first, in serial data transmitted serially in successive data bit groups.

2. Description of Related Art

FIG. 10 is a block diagram of an embodiment of Japanese Patent Publication No. H8-307405. FIG. 10 shows the case that synchronization pattern length is 24 bits and the operation speed is reduced to ⅛ of the bit rate. In FIG. 10, PCM bit serial data is inputted to a shift register 101 and a shift register and latch circuit 102, respectively. The shift register 101 is constituted by 8 bits (1 word), and is adapted to convert bit serial data into 1-word 8-bit word serial data.

The converted word serial data is word-shifted to word latch circuits L101 through L104 arranged in a 4-stage cascade configuration to be sequentially latched with respect to each word. The final stage latch circuit L104 is constituted by 7 bits. Supposing the bits latched in the respective word latch circuits L101 through L104 are denoted in the order b1, b2, b3, . . . , starting from the head bit of latch circuit L104 as shown in FIG. 11, the final bit of the final stage latch circuit L101 becomes b31.

Parallel bits b1 through b31 of all these latch circuits L101 through L104 include 8 frame synchronization patterns (bit combinations) that appear regularly in b1 through b24, b2 through b25, b3 through b26, b4 through b27, b5 through b28, b6 through b29, b7 through b30, and b8 through b31. In consideration of this uncertainty (8 different uncertainties) in Japanese Patent Publication No. H8-307405, 8 frame synchronization parts F101 through F108 are provided so as to correspond to these 8 pairs of patterns, respectively.

The various types of timing signals (latch timing signals, word timing signals, frame timing signals) for the respective frame synchronization parts F101 through F108 are alternatively derived in selector 107 and fed to the next stage circuit such as a shift register and a latch circuit 102. The selector 107 serves to select the timing signals of the frame synchronizing parts (F101 through F108) whose frame synchronization patterns are detected by frame synchronization decision part 105.

Japanese Patent Publication No. H7-221749, Japanese Patent Publication No. H11-145944, Japanese Patent Publication No. 2001-36514, Japanese Patent Publication No. H9-55728 and Japanese Patent Publication No. 2001-308719 disclose examples of other serial data receiving circuits and serial data receiving methods.

While the bit sequence of the serial data inputted to a serial data receiving device is LSB (Least Significant Bit) first, there is case that the bit sequence of word serial data outputted from the serial data receiving device must be MSB (Most Significant Bit) first. Also, on the contrary, while input to the serial data receiving device is carried out by MSB first, there are cases that output from the serial data receiving device must be carried out by LSB first. These exist in various combinations depending on the communication method standards and specifications, standards and the like of the circuit to which the word serial data is to be fed. As a result, there are cases that interconversion on the bit sequence of the serial data, between the LSB first and the MSB first, must be carried out between the input timing and the output timing with respect to the serial data receiving device. However, Japanese Patent Publication No. H8-307405 does not disclose that interconversion is carried out in the serial data receiving device, between the LSB first and the MSB first of serial data. This presents a problem in that it is impossible to accommodate a case that the bit sequence differs between the input timing and the output timing with respect to the serial data receiving device.

In the circuit of Japanese Patent Publication No. H8-307495, selector 107 performs an operation to select a timing signal of the frame synchronization part in which a frame synchronization pattern was detected by a frame synchronization decision part. However, since a specific constitution of the selector 107 is not disclosed, there is a problem that selector 107 cannot be implemented.

SUMMARY

It is an aspect of the embodiments discussed herein to provide a serial data receiving circuit and a serial data receiving method capable of performing interconversion on a bit sequence of data bit groups, between the LSB first and MSB first, in serial data transmitted serially in successive data bit groups.

BRIEF DESCRIPTION OF THE DRAWINGS

FIG. 7 is a circuit configuration diagram of a synchronization code detection circuit 4a;

FIG. 11 is a circuit diagram of a conventional latch circuit and frame synchronization part.

DETAILED DESCRIPTION OF THE PREFERRED EMBODIMENTS

Figure 1:
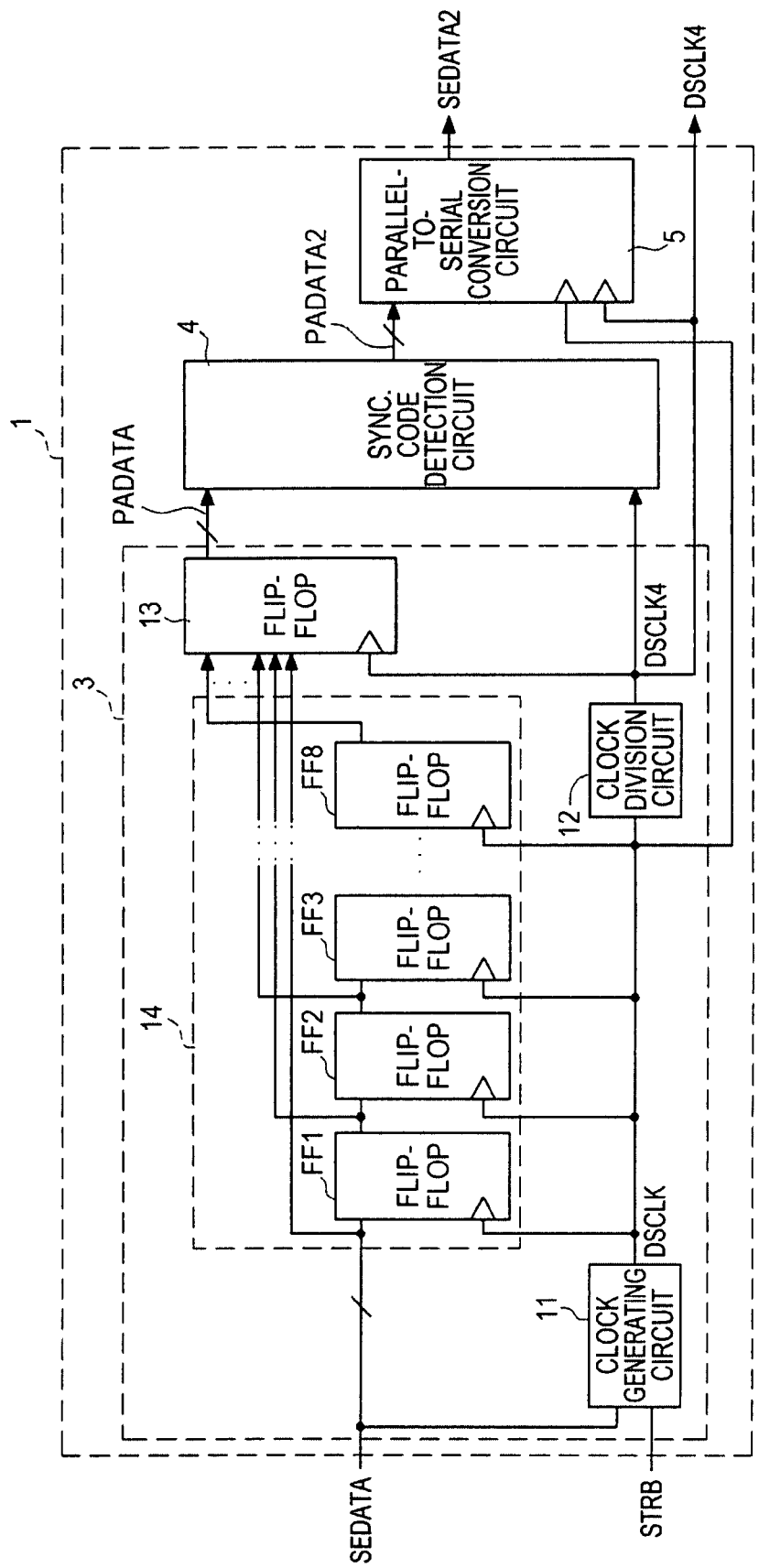
FIG. 1 is a circuit configuration diagram of a serial data receiving circuit 1.

A serial data receiving circuit (or a serial data receiving method) serves to receive serial data, and output data bit groups partitioned into m bits. The serial data is serially transmitted in successive m-bit (m being a natural number) data bit group having an LSB first or MSB first bit sequence. Since the data is not synchronized at the time of input to the serial data receiving circuit, the partitioning position of the data bit groups partitioned in m bits is not recognized. The shift register circuit (or the step of capturing serial data) captures at least (m+k−1) bit serial data, and each time m-bit serial data is received, outputs m different bit strings consisting of k bits, with each bit from bit 1 to bit m being handled as a start position.

The shift register circuit (or a step of outputting a bit string) performs an output operation every time m-bit serial data is received, allowing to perform an operation to convert the serial data to m-bit parallel data. The serial data is inputted by successively inputting data bit groups partitioned into m bits. The serial-to-parallel conversion in the shift register circuit (or the step of outputting bit strings) is carried out in a state in which it is unclear where exactly in the parallel data lies the start position of the head bit in the data bit groups partitioned into m bits. Specifically, the serial data is randomly converted into m-bit parallel data and the result is outputted.

The shift register circuit outputs m different bit strings consisting of k bits, with every bit from bit 1 through bit m of the shift register circuit being handled as a start position. In the step of outputting the bit strings, m different bit strings consisting of k bits are outputted, with each bit from bit 1 through bit m of the serial data captured in the step of capturing serial data being handled as a start position. Specifically, the shift register circuit (or the step of outputting the bit strings) outputs m different bit strings having a bit length of k bits, while shifting the start position of the head bit by one bit at a time. As a result, the start position of a head bit in any one of the m different bit strings becomes coincident with the start position of the head bit in the data bit groups.

Further, m comparison circuits (or the step of performing coincidence detection operation) are provided, each corresponding to one of m different bit strings. The comparison circuit (or the step of performing coincidence detection operation) performs a coincidence detection operation with respect to each of the m different bit strings to detect coincidence of the synchronization pattern with the bit strings. Specifically, there are provided a shift register circuit (or a step of outputting bit strings) that outputs m-bit string candidates in which the start position of the head bit in data bit groups is possibly accurately recognized from the data that has been converted to parallel data, and m comparison circuits (or the step of carrying out coincidence detection operation). The coincidence detection operation is carried out in any of the m comparison circuits (or the step of carrying out coincidence detection operation). As a result, the synchronization pattern can be detected from m-bit parallel data that was randomly converted.

The selector circuit (or the step of selecting and outputting a bit string) selects a bit string on which the coincidence detection operation was performed in the comparison circuit (or the step of performing coincidence detection operation) and outputs the result. As a result, it is possible to select a bit string in which the start position of the head bit in data bit groups which are the object of detection, was accurately recognized. This makes it possible to obtain data bit group which are correctly partitioned.

The conversion circuit (or the step of carrying out a conversion operation) performs a conversion operation to reverse a bit sequence of a bit string every m bits starting from the head bit. If the conversion circuit is provided in a connection path between the shift register circuit and the comparison circuit, interconversion is carried out on the bit sequence of the data bit groups, between the MSB first and the LSB first, for every data bit group, with respect to m bit string candidates in which the start position of the head bit in the data bit groups is possibly accurately recognized. If the conversion circuit is provided in an output path of the selector circuit, interconversion is carried out on the bit sequence of the data bit groups between the MSB first and the LSB first, for every data bit group, with respect to the bit strings in which the start position of the head bit in the data bit groups was accurately recognized.

As described in the above, data bit groups partitioned into m bits can be accurately recognized from serial data transmitted serially in successive m-bit (m being a natural number) data bit groups. Interconversion can be performed on the bit sequence of the data bit groups between the LSB first and the MSB first, between the input timing to the serial data receiving circuit and the output timing from the serial data receiving circuit. As a result, it is possible to handle cases in which the bit sequences differ at the input timing and the output timing with respect to the serial data receiving circuit.

A general description will now be given on the serial data receiving circuit. There has been known a serial data receiving circuit which performs signal synchronization detection such as frame synchronization detection, etc. to determine a time-series bit group partitioning to identify the role of each bit. For serial transmission in a communication system, there has been used a serial data receiving circuit which includes a circuit having a function of receiving serial data and converting the serial data to word serial data partitioned into data bit groups, for example. The serial data is serially transmitted in successive data bit groups having a predetermined number of bits. The serial data includes a synchronization pattern signal. The receiving side performs synchronization by using the synchronization pattern signal as a reference. As a result, the head bit in the data bit groups can be accurately recognized from the transmitted bit serial signal, which makes it possible to recognize the partitioning position without any bit displacements.

A first embodiment of the serial data receiving circuit 1 of the present application will be described with reference to FIG. 1 through FIG. 6. The serial data of the present embodiment is transmitted in the following format: start code→valid data→end code. Here, the valid data has a fixed length. A case will be described in which the m bits in the data bit groups are 8 bits, and the k bits in the synchronization pattern signal are 32 bits. Also, a case will be described in which the bit sequence of the serial data SEDATA to be inputted to the serial data receiving circuit 1 is LSB first, and the bit sequence of the serial data SEDATA2 to be outputted must be MSB first. Here, the serial data SEDATA is transmitted serially using the LVDS scheme (Low Voltage Differential Signaling).

First, the configuration of the serial data receiving circuit 1 will be described. FIG. 1 shows a circuit configuration diagram of the serial data receiving circuit 1 according to the first embodiment. The serial data receiving circuit 1 is provided with a serial-to-parallel conversion circuit 3, a synchronization code detection circuit 4, and a parallel-to-serial conversion circuit 5. The serial-to-parallel conversion circuit 3 is provided with a clock generating circuit 11, a clock division circuit 12, a flip-flop 13 and a shift register 14. The clock generating circuit 11 receives the serial data SEDATA and a strobe signal STRB, and outputs a clock signal DSCLK. The serial data SEDATA is inputted as LSB first every 8-bit data bit group. However, since the data is not synchronized at the time of being inputted into the serial data receiving circuit 1, the partitioning position of the data bit groups partitioned into 8 bits is not recognized. The shift register 14 is provided with flip flops FF1 through FF8 which are connected in series. The flip flop FF1 receives serial data SEDATA. The flip flops FF1 through FF8 each receive the clock signal DSCLK. The flip flop 13 receives the outputs from each of the flip flops FF1 through FF8, and the clock signal DSCLK 4 outputted from the clock division circuit 12.

The circuit configuration of the synchronization code detection circuit 4 will be described using FIG. 2. The synchronization code detection circuit 4 is provided with a 40-bit shift register 10, a bit sequence conversion circuit 20, a signal branching circuit 25, a start code detection circuit 30, a first flip flop 40, an OR circuit 50, a selector circuit 60, a second flip flop 80 and a synchronization pattern register circuit 90. The bit sequence conversion circuit 20 is provided with conversion parts C1 through C8, and bit string register circuits R1 through R8. The start code detection circuit 30 is provided with coincidence detection circuits D1 through D8.

The shift register 10 is provided with 8-bit latch circuits L1 through L5. The latch circuits L1 through L5 are arranged in a 5-stage cascade configuration, and together constitute a 40-bit shift register. The latch circuit L1 receives parallel data PADATA. The latch circuits L1 through L5 each receive a clock signal DSCLK4. The shift register 10 outputs 32-bit bit strings BS1 through BS8, and inputs them to the bit sequence conversion circuit 20.

The bit sequence conversion circuit 20 is provided with conversion parts C1 through C8 and bit string register circuits R1 through R8. The conversion parts C1 through C8 are provided between each of the connection paths between the shift register 10 and the bit string register circuits R1 through R8. The conversion parts C1 through C8 receive bit strings BS1 through BS8. The conversion parts C1 through C8 output converted bit strings CBS1 through CBS8, and input them to bit string register circuits R1 through R8, respectively.

The converted bit strings CBS1 through CBS8 outputted from the bit string register circuits R1 through R8 are inputted to signal branching circuit 2S. The signal branching circuit 25 outputs upper bit strings HCBS1 through HCBS8 which are the upper 8-bit bit strings of the converted bit strings CBS1 through CBS8, and inputs them to selector circuit 60. The signal branching circuit 25 outputs converted bit strings CBS1 through CBS8, and respectively inputs them to the coincidence detection circuits D1 through D8 of start code detection circuit 30.

The synchronization pattern register circuit 90 serves as a 32-bit register. The LSB of a synchronization pattern RS is held in bit (1) of the synchronization pattern register circuit 90, and the MSB of the synchronization pattern RS is held in bit (32). The synchronization pattern RS outputted from the synchronization pattern register circuit 90 is inputted to each of the coincidence detection circuits D1 through D8 of start code detection circuit 30. The coincidence detection circuits D1 through D8 output detection signals DS1 through DS8. The OR circuit 50 receives detection signals DS1 through DS8 and outputs a detection signal DDS.

The first flip flop 40 receives the detection signals DS1 through DS8, the clock signal DSCLK4 and the detection signal DDS, and outputs the lock signals LS1 through LS8. Selector circuit 60 receives the upper bit strings HCBS1 through HCBS8, detection signals DS1 through DS8, and lock signals LS1 through LS8, respectively.

Figure 3:
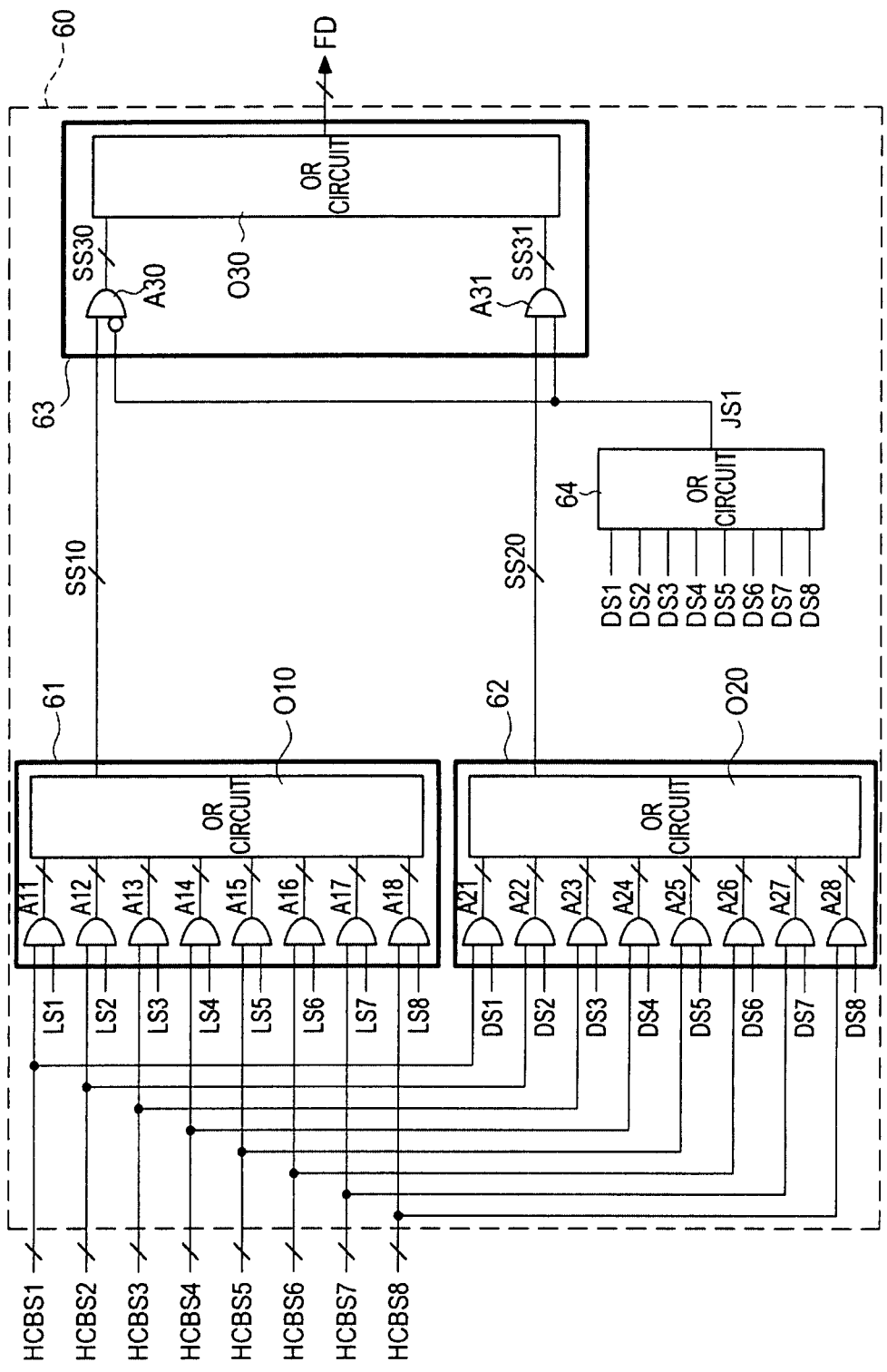
FIG. 3 is a circuit configuration diagram of a selector circuit 60.

FIG. 3 shows a circuit configuration of the selector circuit 60. The selector circuit 60 is provided with a first selector 61, a second selector 62, a third selector 63 and an OR circuit 64. The first selector 61 is provided with AND circuits A11 through A18 and an OR circuit O10. The AND circuits A11 through A18 receive the upper bit strings HCBS1 through HCBS8, and lock signals LS1 through LS8, respectively. The OR circuit O10 receives all the outputs of AND circuits A11 through A18 and outputs output data SS10. The second selector 62 is provided with AND circuits A21 through A28, and an OR circuit O20. The AND circuits A21 through A28 receive the upper bit strings HCBS1 through HCBS8, and detection signals DS1 through DS8, respectively. The OR circuit O20 receives all the outputs of AND circuits A21 through A28 and outputs the output data SS20.

The OR circuit 64 receives detection signals DS1 through DS8 and outputs an output signal JS1. The third sector 63 is provided with AND circuits A30 and A31, and an OR circuit 30. The AND circuit A30 receives output data SS10 and the inversion signal of the output signal JS1, and outputs output data SS30. The AND circuit A31 receives the output data SS20 and the output signal JS1, and outputs output data SS31. The OR circuit O30 receives the output data SS30 and SS31, and outputs detection data FD. The upper bit strings HCBS1 through HCBS8, the output data SS10 through SS30 and SS31, and the detection data FD are each 8-bit data. The AND circuits A11 through A18, the AND circuits A21 through A28, the AND circuits A30 and A31 and the OR circuits O10 through O30 are each arranged in an 8-circuit configuration, each corresponding to the inputted 8-bit data, respectively.

Figure 2:
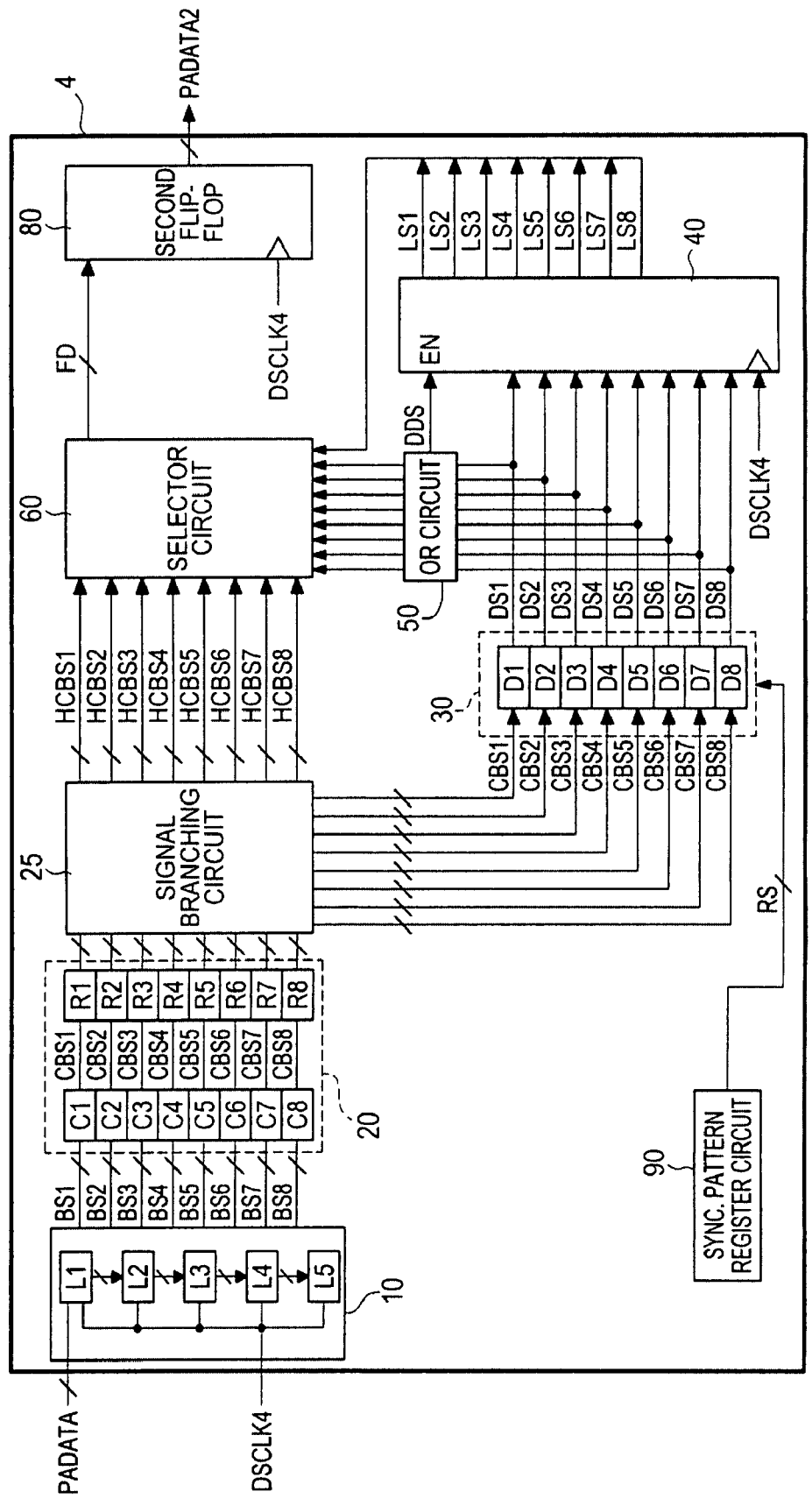
FIG. 2 is a circuit configuration diagram of a synchronization code detection circuit 4.

The detection data FD outputted from the selector circuit 60 is inputted to the second flip flop 80 (FIG. 2). The second flip flop 80 receives a clock signal DSCLK4 and then outputs parallel data PADATA2.

The parallel data PADATA2 is inputted to the parallel-to-serial conversion circuit 5 (FIG. 1). The parallel-to-serial conversion circuit 5 receives the clock signal DSCLK4 and the clock signal DSCLK. Then, serial data SEDATA2 is outputted in order from the upper bit of the parallel data PADATA2, in response to the clock signal DSCLK. The serial data SEDATA2 is outputted from the serial data receiving circuit 1, together with the clock signal DSCLK4.

Next, the operation of the serial data receiving circuit 1 will be described. First, the operation of the serial-to-parallel conversion circuit 3 (FIG. 1) will be described. The shift register 14 shifts the inputted serial data SEDATA by 1 bit at a time, in response to a leading edge and a trailing edge of the clock signal DSCLK (325 (MHz)). The clock division circuit 12 feeds the clock signal DSCLK4 (81.25 (MHz)) obtained by performing ¼ division on the clock signal DSCLK to the flip flop 13 and the synchronization code detection circuit 4, and outputs the signal to the exterior of the serial data receiving circuit 1. The flip flop 13 performs 1:8 serial-to-parallel conversion with reference to the clock signal DSCLK4 transmitted from the clock division circuit 12. Specifically, the shift register 14 and the flip flop 13 sequentially perform serial-to-parallel conversion on the serial data SEDATA, with respect to each 8 bit data bit group. This conversion from the serial data SEDATA to the parallel data PADATA is performed in the state that detection of the synchronization pattern has not been made. The shift register 14 randomly partitions the serial data SEDATA into 8-bit data bit groups. Of the partitioned serial data SEDATA, the bit held in the flip flop FF8 is handled as LSB, and the bit held in the flip flop FF1 is handled as MSB. The 8-bit parallel data PADATA and the clock signal DSCLK4 are outputted from the serial-to-parallel conversion circuit 3, and inputted to the synchronization code detection circuit 4.

The operation of the synchronization code detection circuit 4 will be described using FIG. 2. The shift register 10 serves to capture 40-bit data. Bit (1) to bit (8) of the shift register 10 are constituted by the latch circuit L1. Bit (33) to bit (40) of the shift register 10 are constituted by the latch circuit L5 in a manner similar to that described above. The shift register shifts the data of each of the latch circuits L1 through L4 to the latch circuits L2 through L5, and captures the parallel data PADATA in the latch circuit L1, in response to a leading edge of the clock signal DSCLK4. The shift register 10 thus performs an 8-bit shift operation in which the data is updated every 8 bits. At this time, the 1$^{st}$ bit which is the LSB of the serial data SEDATA which was randomly partitioned in 8-bit data bit groups is captured in bit (8) of the latch circuit L1. The 8$^{th}$ bit which is the MSB of the serial data SEDATA is captured in bit (1) of the latch circuit L1.

Figure 4:
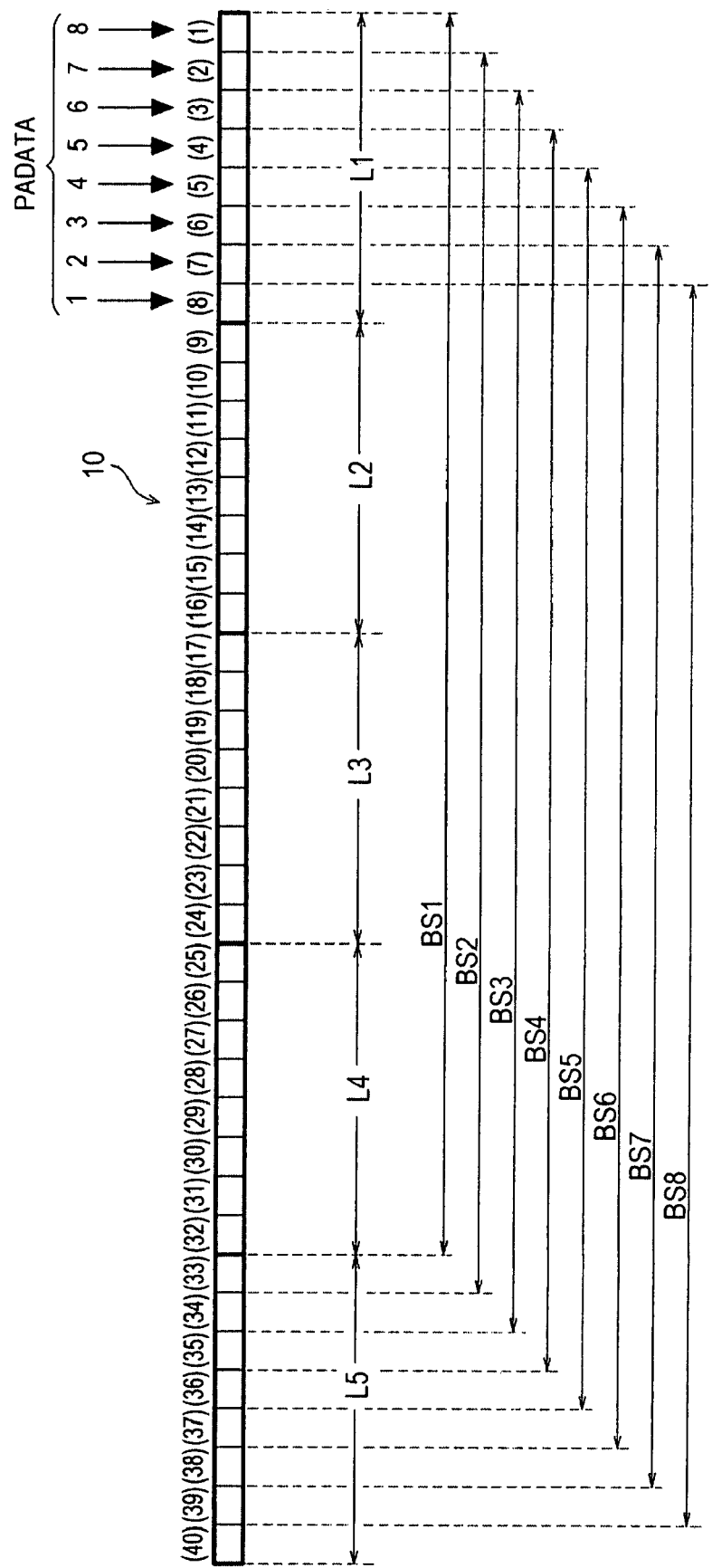
FIG. 4 is a view showing a frame format of bit strings BS1 through BS8.

The shift register 10 outputs bit strings BS1 through BS8 in response to the clock signal DSCLK4. The bit strings BS1 through BS8 are 8 different bit strings having a 32-bit bit length that are obtained by shifting the start position of the head bit in turn by 1 bit in the shift register 10. More specifically, as shown in FIG. 4, the bit strings BS1 through BS8 are 8 different bit strings consisting of 32 bits, in which each bit from bit (1) to bit (8) of the shift register 10 serves as a start point, and each bit from bit (32) to bit (39) serves as an end point. The bit strings BS1 through BS8 outputted from the shift register 10 are respectively inputted to the conversion parts C1 through C8 of the bit sequence conversion circuit 20.

The operation of the conversion parts C1 through C8 will be described. The conversion parts C1 through C8 are constituted by wiring that connects the shift register 10 with the bit string register circuits R1 through R8.

Figure 5:
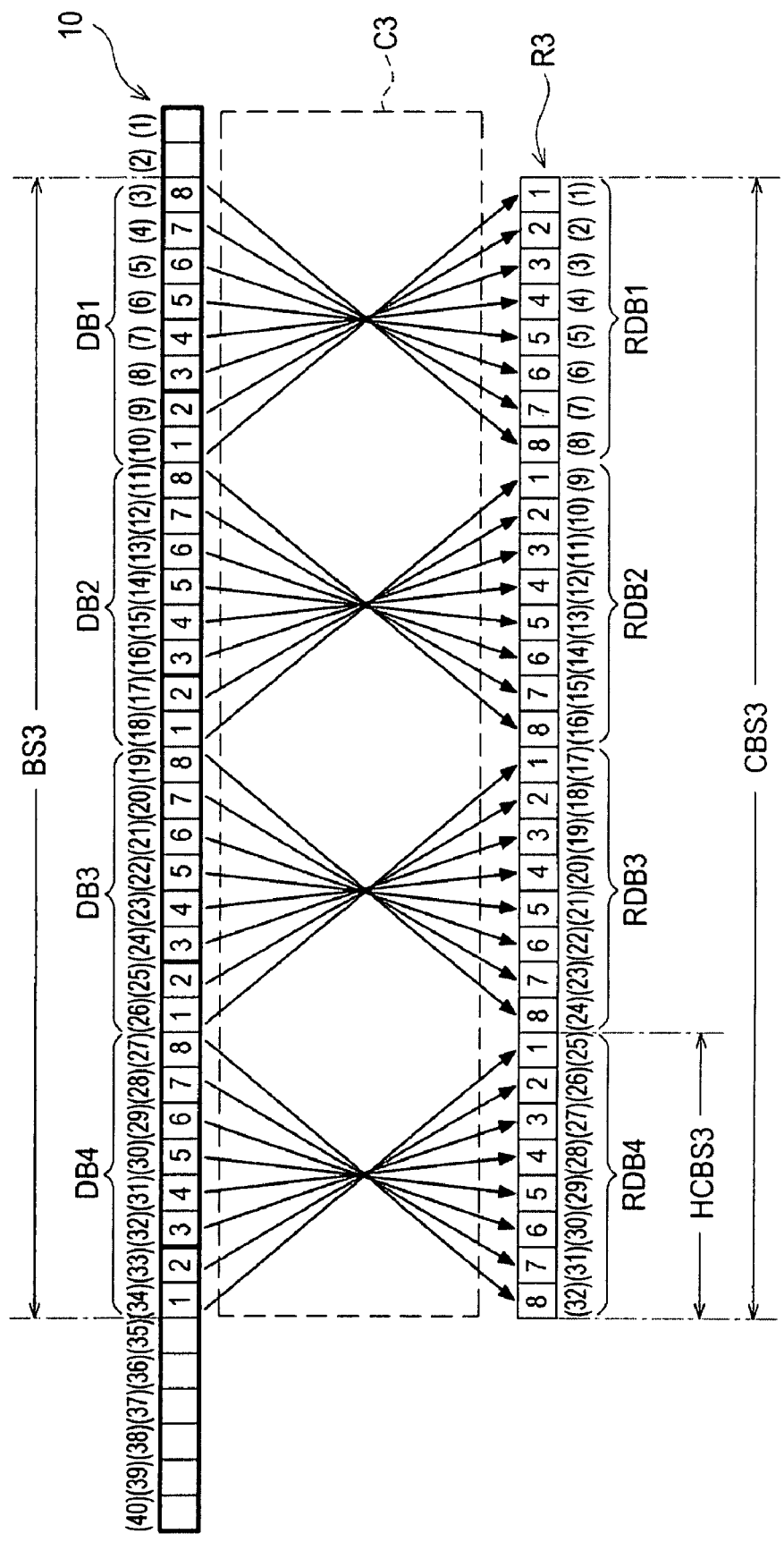
FIG. 5 is a view showing a frame format of a conversion part C3.

The operation of the conversion part C3 will be described as an example, using FIG. 5. The conversion part C3 receives the bit string BS3. The bit string BS3 is a bit string corresponding to a bit range from bit (3) to bit (34) of the shift register 10, and is constituted of the first data bit group DB1 through the fourth data bit group DB4. The 1$^{st}$ bit serving as the LSB of the first data bit group DB1 corresponds to bit (10) of the shift register, and the 8$^{th}$ bit serving as the MSB corresponds to bit (3) of the shift register 10. The first bit serving as the LSB of the second data bit group DB2 corresponds to bit (18) of the shift register 10, and the 8$^{th}$ bit serving as the MSB corresponds to bit (11) of the shift register 10. The first bit serving as the LSB of the third data bit group DB3 corresponds to bit (26) of the shift register 10, and the 8$^{th}$ bit serving as the MSB corresponds to bit (19) of the shift register 10. The first bit serving as the LSB of the fourth data bit group DB4 corresponds to bit (34) of the shift register 10, and the 8$^{th}$ bit serving as the MSB corresponds to bit (27) of the shift register 10. With this configuration, the first data bit group DB1 through the fourth data bit group DB4 that exist inside the bit string BS3 correspond to the data from bit (34) through bit (3) of the shift register 10, and has an LSB first bit sequence every 8 bits.

The 8$^{th}$ bit serving as the MSB of the first data bit group DB1 and corresponding to bit (3) of the shift register 10 is inputted by the conversion part C3 to bit (8) of the bit string register circuit R3. The 7$^{th}$ bit through the 1$^{st}$ bit corresponding to bits (4) (5) (6) (7) (8) (9) and (10) of the shift register 10 are inputted by the conversion part C3 to bits (7) (6) (5) (4) (3) (2) and (1), respectively, of the bit string register circuit R3, in a manner similar to that described above. As a result, the first data bit group DB1 is converted to the converted first data bit group RDB1 in the conversion part C3. The 8$^{th}$ bit serving as the MSB of the converted first data bit group RDB1 corresponds to bit (8) of the bit string register circuit R3, and the 1$^{st}$ bit serving as the LSB corresponds to bit (1) of the bit string register circuit R3. Conversion is carried out so as to reverse the respective bit sequences in the second data bit group DB2 through the fourth data bit group DB4, in a manner similar to that described above. As a result, the converted second data bit group RDB2 through the converted fourth data bit group RDB4 are obtained. The converted first data bit group RDB1 through the converted fourth data bit group RDB4 that exist inside the converted bit string CBS3 correspond to the data from bit (32) to bit (1) of the bit string register circuit R3, and have an MSB first bit sequence every 8 bits. The converted bit string CBS3 is constituted from the converted first data bit group RDB1 through the converted fourth data bit group RDB4, which means that the LSB (bit (1) of the bit string register circuit R3) of the converted first data bit group RDB1 becomes the LSB of the converted bit string CBS3, and the MSB (bit (32) of the bit string register circuit R3) of the converted fourth data bit group RDB4 becomes the MSB of the converted bit string CBS3.

All conversion parts other than the conversion part C3 perform the conversion operation in which the bit sequence of the data bit groups is converted, to obtain the converted bit strings CBS1 through CBS8, in a manner similar to that described above. As shown in FIG. 2, the converted bit strings CBS1 through CBS8 are outputted from the conversion parts C1 through C8, and are held in the bit string register circuits R1 through R8. The converted bit strings CBS1 through CBS8 outputted from the bit string register circuits R1 through R8 are inputted to the start code detection circuit 30 through the signal branching circuit 25.

The operation of the start code detection circuit 30 will be described using FIG. 2 through FIG. 6. The coincidence detection circuits D1 through D8 make a determination as to whether the synchronization pattern RS held in the synchronization pattern register circuit 90 is coincident with the converted bit strings CBS1 through CBS8 held in the bit string register circuits R1 through R8. The determination on coincidence is made by comparing bits (1), bits (2) . . . bits (32) in the synchronization pattern register circuit 90 and the bit string register circuits R1 through R8. Since the bits from the LSBs to the MSBs in the synchronization pattern RS and the converted bit strings CBS1 through CBS8 are sequentially compared, their respective bit sequences are compared in the same state. As a result, the coincidence comparison can be carried out between the synchronization pattern RS and the converted bit strings CBS1 through CBS8.

Since 8 coincidence detection circuits D1 through D8 are provided and each of them perform detection of the synchronization pattern RS, coincidence detection is carried out simultaneously in the coincidence detection circuits D1 through D8. As a result, coincidence detection can be carried out using the divided clock signal DSCLK4 (81.25 (MHz)), thereby making it possible to reduce operation speed as compared with the case that the coincidence detection is carried out sequentially in response to the clock signal DSCLK (325 (MHz)).

Next, a case in which coincidence detection is carried out in the coincidence detection circuit D3 will be described as an example, using the timing chart of FIG. 6. Here, the coincidence detection circuit D3 detects that the converted bit string CBS3 and the synchronization pattern RS are coincident at time t1. At this time, a detection signal DS3 serving as a high level pulse signal is outputted from the coincidence detection circuit D3 provided in the start code detection circuit 30 (FIG. 2) (region AR1). Since the high level detection signal DS3 is inputted to the AND circuit A23 of the second selector 62 in the selector circuit 60 (FIG. 3) and the output of the AND circuit A23 is decided depending on the upper bit string HCBS3 and also, since the other detection signals DS1, DS2, DS4 through DS8 are low level, the outputs of the other AND circuits A21, A22, A24 through A28 are fixed to a low level. The upper bit string HCBS3 is outputted from the OR circuit O20 as output data SS20. As a result, the second selector 62 selects the upper bit string HCBS3 in response to the high level detection signal DS3. Here, the upper bit string HCBS3 consists of the upper 8 bits including bit (32), the MSB of the converted bit string CBS3, to bit (25).

The high level detection signal DS3 is inputted in the OR circuit 64, and as a result, a high level output signal JS1 is outputted and inputted to AND circuits A30 and A31. Since in the period between time t1 to t2a, the output of the AND circuit A31 is decided depending on the output data SS20 and the output of the AND circuit A30 is fixed to a low level, the third selector 63 selects the output data SS20 and the output data SS10 is masked. Then, the output data SS20 is outputted from the third selector 63 as detection data FD, and the detection data FD is inputted to the second flip flop 80 (FIG. 2). At this time, the $8^{th}$ bit serving as the MSB of the upper bit string HCBS3 is inputted to bit (1) of the second flip flop 80, and the $1^{st}$ bit serving as the LSB is inputted to bit (8). Detection data FD is outputted as 8-bit parallel data PADATA2 from the second flip flop 80, in response to the clock signal DSCLK4.

Figure 6:
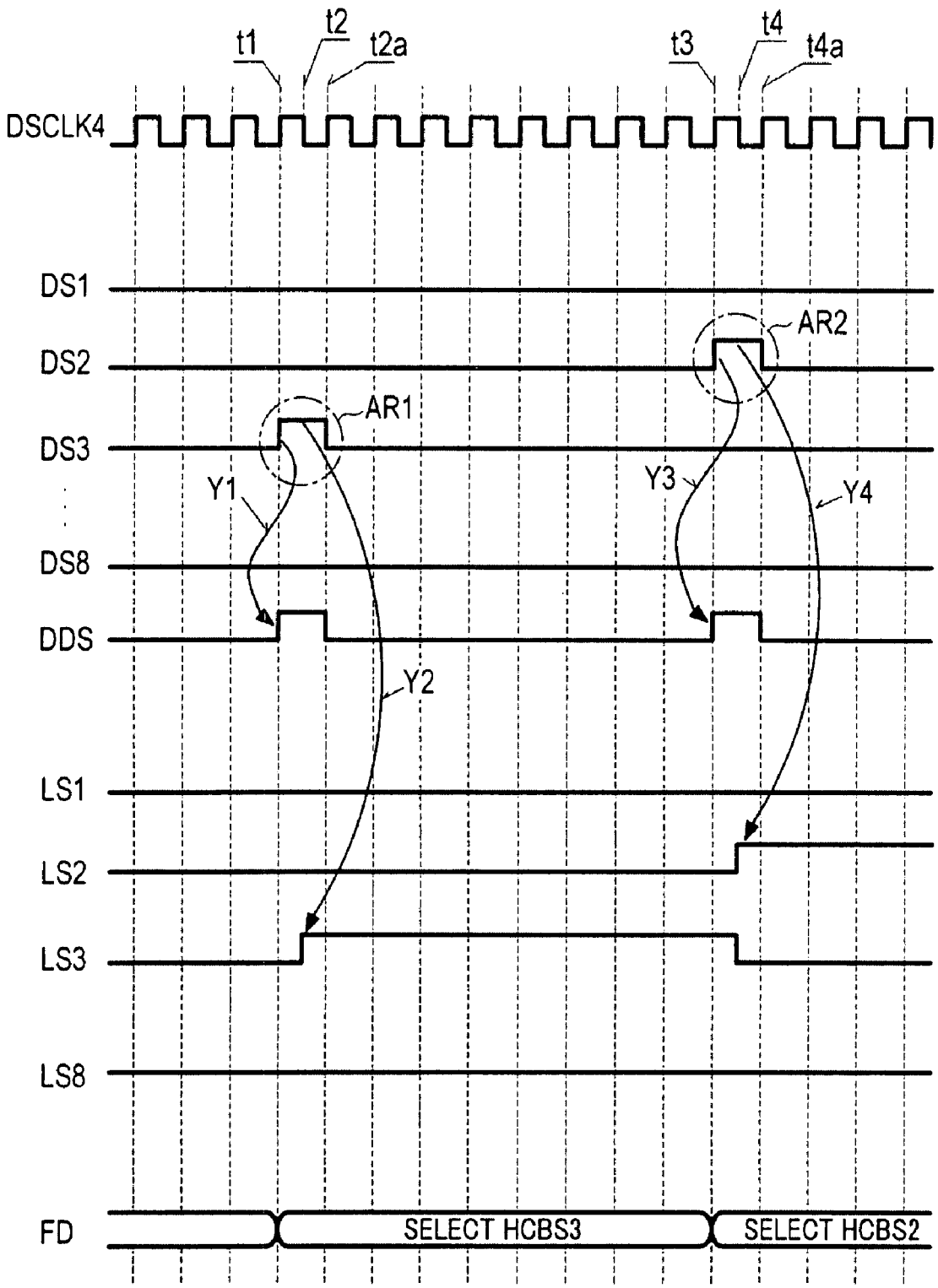
FIG. 6 is a timing chart of a serial data receiving circuit 1.

At time t1, the high level detection signal DS3 is inputted to the OR circuit 50 (FIG. 2) and a high level detection signal DDS is outputted from the OR circuit 50 (arrow Y1 in FIG. 6). As a result of inputting the high level detection signal DDS to an enable terminal EN of the first flip flop 40, the high level detection signal DS3 is captured in the first flip flop 40. Thus, the lock signal LS3 outputted from the first flip flop 40 is fixed to a high level after time t2 (arrow Y2). The high level of the lock signal LS3 is maintained until time t4, when the next coincidence detection is carried out.

The high level lock signal LS3 is inputted to the AND circuit A13 of the first selector 61 (FIG. 3), and the output of the AND circuit A13 is decided depending on the upper bit string HCBS3. Since the other detection signals LS1, LS2, LS4 through LS8 are at low level, the outputs of the other AND circuits A11, A12, A14 through A18 are fixed to a low level. Then, the upper bit string HCBS3 is outputted from the OR circuit O10 as output data SS10. As a result, the first selector 61 selects the upper bit string HCBS3 in response to the high level detection signal LS3.

As a result of inputting the low level detection signals DS1 through DS8 to the OR circuit 64, the output signal JS1 of the OR circuit 64 is set to a low level after time t2a. Since in the period from time t2a to t3, the output of the AND circuit A30 is decided depending on the output data SS10 and the output of the AND circuit A31 is fixed to a low level, the output data SS10 is selected in the OR circuit O30 and the output data SS20 is masked. The output data SS10 is outputted from the third selector 63 as detection data FD.

As a result, the state of detected coincidence between the converted bit string CBS3 and the synchronization pattern RS is held in the first flip flop 40 and the selector circuit 60 during the period from time t1 to time t3. Thus, during the period from time t1 through time t3, the selector circuit 60 accurately recognizes the head bit of the fourth data bit group DB4, and correctly extracts the upper bit string HCBS3 without any bit displacement, which makes it possible to output the upper bit string HCBS3 as detection data FD. The extraction operation of the upper bit string HCBS3 is continued until the next coincidence detection operation is carried out.

Next, the case that the next coincidence detection operation is performed in the coincidence detection circuit D2 at time t3 will be described. At this time, the detection signal DS2 serving as a high level pulse signal is outputted from the coincidence detection circuit D2 (area AR2). The high level detection signal DS2 is inputted to the AND circuit A22 of the second selector 62, and as a result, the upper bit string HCBS2 is outputted from the second selector 62 as output data SS20.

At time t3, the high level detection signal DS2 is inputted to the OR circuit 50 (FIG. 2), and the high level detection signal DDS is outputted from the OR circuit 50 (arrow Y3 in FIG. 6). After time t4, the lock signal LS2 outputted from the first flip flop 40 is fixed to a high level (arrow Y4). As described in the above text, during the period from time t3 to t4a, the output data SS20 (the upper bit string HCBS2) is outputted from the third selector 63 as detection data FD.

As a result of inputting the low level detection signals DS1 through DS8 to the OR circuit 64, the output signal JS1 of the OR circuit 64 is set to a low level after time t4a. As described in the above, after time t4a, the output data SS10 (upper bit string HCBS2) is outputted from the third selector 63 as detection data FD.

As a result, the state of detected coincidence between the converted bit string CBS2 and the synchronization pattern RS is held in the first flip flop 40 and the selector circuit 60 during the period after time t3. Then, in the period after time t3, the selector circuit 60 correctly extracts the upper bit string HCBS2 without any bit displacement, and outputs the upper bit string HCBS2 as detection data FD. The detection data FD is outputted from the second flip flop 80 as 8-bit parallel data PADATA2, in response to the clock signal DSCLK4.

The operation of the parallel-to-serial conversion circuit 5 will be described. The parallel data PADATA2 outputted from the synchronization code detection circuit 4 is inputted to the parallel-to-serial conversion circuit 5. The parallel-to-serial conversion circuit 5 is provided with a buffer circuit and a parallel-to-serial conversion part which are not shown. The buffer circuit receives 8-bit parallel data PADATA2 in synchronization with the clock signal DSCLK4 and holds this data until a pulse of the next clock signal DSCLK4 is inputted, and then outputs the parallel data PADATA2 to the parallel-to-serial conversion part. The parallel-to-serial conversion part receives the parallel data PADATA2 from the buffer circuit in synchronization with the clock signal DSCLK4, and outputs this data as serial data SEDATA 2 in synchronization with the clock signal DSCLK. At this time, the parallel-to-serial conversion part outputs the bits in the order from the $8^{th}$ bit which serves as the MSB of the upper bit string HCBS3 to the $1^{st}$ bit which serves as the LSB, in response to the clock signal DSCLK. As a result, the serial data SEDATA2 becomes an MSB first bit sequence.

As a result, the serial data receiving circuit 1 can convert the LSB first bit sequence of the data bit groups constituting the serial data SEDATA to be inputted to the serial data receiving circuit 1 into serial data SEDATA2 having an MSB first bit sequence, and output the resulting data. Then, the serial data SEDATA2 and the clock signal DSCLK4 are outputted from the serial data receiving circuit 1. As a result, the data bit groups partitioned in 8 bits can be accurately recognized from the serial data SEDATA2 by employing the clock signal DSCLK4 in a circuit at a later stage of the serial data receiving circuit 1.

Accordingly, in the serial data receiving circuit 1 described in the first embodiment, the data bit groups accurately partitioned into 8 bits can be recognized from the serial data SEDATA that is serially transmitted in successive 8-bit data bit groups. The bit sequence of the data bit groups can be converted from LSB first to MSB first during a period between the input timing to the serial data receiving circuit 1 and the output timing from the serial data receiving circuit 1. As a result, it is possible to accommodate a case in which while the bit sequence of the data bit groups in the serial data SEDATA inputted to the serial data receiving circuit 1 is LSB first, the bit sequence of the data bit groups in the serial data SEDATA2 outputted from the serial data receiving circuit 1 must be MSB first.

The serial data receiving circuit 1 carries out an operation in which the serial data SEDATA is converted once into parallel data PADATA, and an operation in which this data is converted again to serial data SEDATA2. As a result of performing parallel conversion one time, firstly, it is possible to reduce the operation speed at the time the bit sequence of the data bit groups constituting the serial data SEDATA is converted from LSB first to MSB first. This configuration helps eliminate the need to use a high-speed element or circuit.

As a result of performing the parallel conversion, secondly, the serial data is converted into 8-bit parallel data PADATA, and as result of providing 8 coincidence detection circuits D1 through D8 and carrying out detection of the synchronization pattern simultaneously in each of the coincidence detection circuits D1 through D8, the operation speed associated with the detection operation can be reduced. Thus, the setup time, the holdup time, and the like can be secured even in the event coincidence between the synchronization pattern RS and the converted bit strings is detected from the serial data SEDATA having a high bit rate. This eliminates the need to use a high-speed element or circuit, which in turn makes it possible to reduce development costs and consumption power, and helps minimize circuit size.

Figure 7:
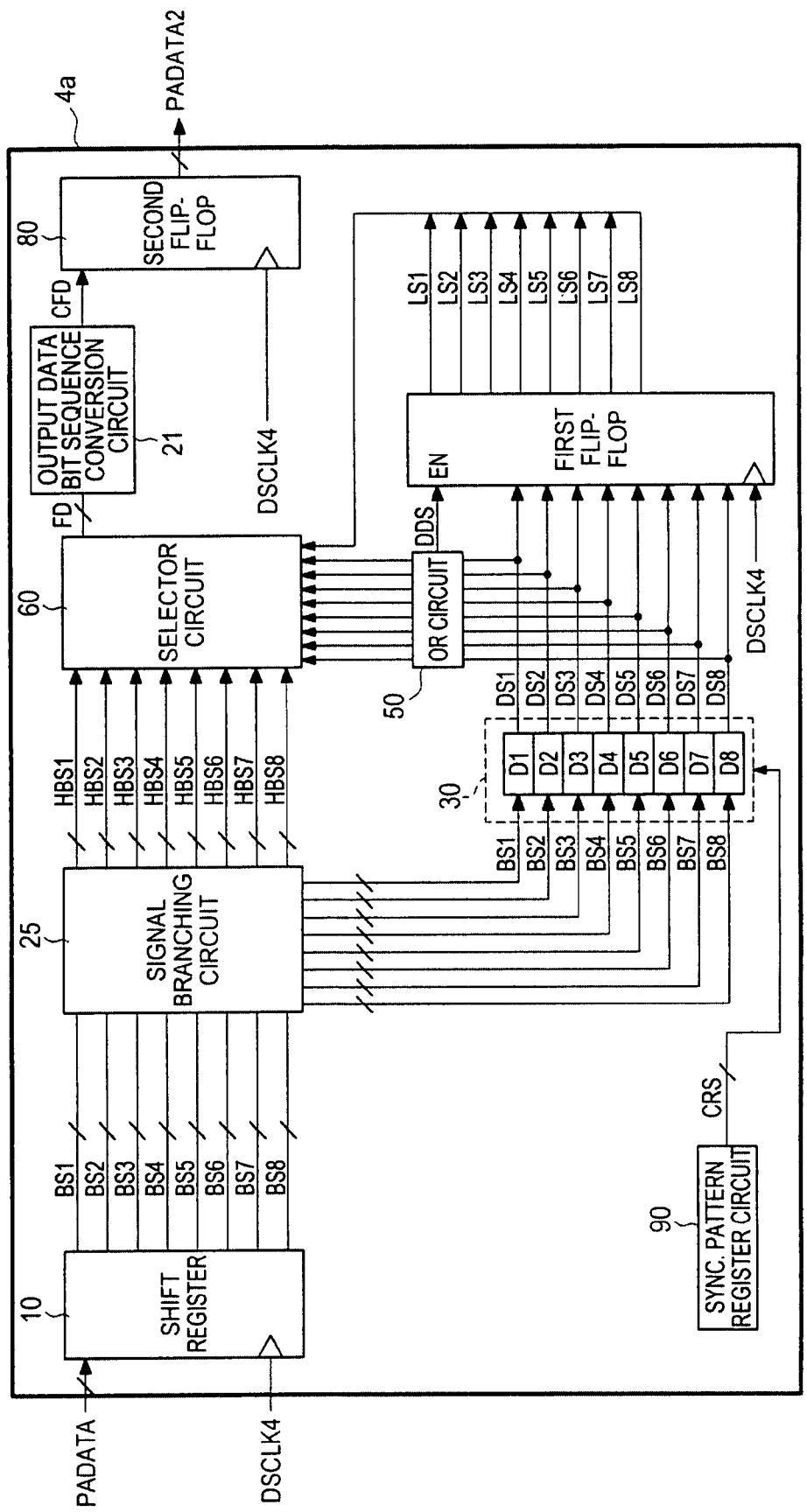

The second embodiment of the present application will be described using FIG. 7. Unlike the synchronization code detection circuit 4 according to the first embodiment (FIG. 2), a synchronization code detection circuit 4a according to the second embodiment is not provided with a bit sequence conversion circuit 20. A second synchronization pattern CRS is held in a synchronization pattern register circuit 90, in place of the synchronization pattern RS. The $32^{nd}$ bit serving as the MSB of the second synchronization pattern CRS is held in bit (1) of the synchronization pattern register circuit 90, and the $1^{st}$ bit serving as the LSB is held in bit (32) of the synchronization pattern register circuit 90. The second synchronization pattern CRS outputted from the synchronization pattern register circuit 90 is inputted in each of the coincidence detection circuits D1 through D8. An output data bit sequence conversion circuit 21 is arranged in the connection path between the selector circuit 60 and the second flip flop 80. The output data bit sequence conversion circuit 21 receives the detection data FD, and outputs the converted detection data CFD. A signal branching circuit 25 outputs upper bit strings HBS1 through HBS8 which are the upper 8-bit bit strings of the bit strings BS1 through BS8, in place of the upper bit strings HCBS1 through HCBS8. The rest of the configuration is the same as the synchronization code detection circuit 4 according to the first embodiment, and therefore, further description thereof is hereby omitted.

The operation of the coincidence detection circuit D3 will be described as an example. As shown in FIG. 5, bit string BS3 is a bit string corresponding to bit (3) to bit (34) of the shift register 10, and is constituted by first data bit group DB1 through fourth data bit group DB4. The first data bit group DB1 through the fourth data bit group DB4 correspond to the data from bit (34) to bit (3) of the shift register 10, and have an LSB first bit sequence every 8 bits. The MSB (bit (3) of the shift register 10) of the first data bit group DB1 becomes the MSB of the bit string BS3, and the LSB (bit (34) of the shift register 10) of the fourth data bit group DB4 becomes the LSB of the bit string BS3. On the other hand, the second synchronization pattern CRS holds the $32^{nd}$ bit serving as the MSB in bit (1) of the synchronization pattern register circuit 90 and holds the first bit serving as the LSB in bit (32).

The coincidence detection circuit D3 compares bit (1) of the synchronization pattern register circuit 90 with bit (3) of the shift register 10, which means that the MSBs of the second synchronization pattern CRS and of the bit string BS3 are compared. The comparison between bit (2) of the synchronization pattern register circuit 90 and bit (4) of the shift register 10, . . . , and the comparison between bit (32) (LSB of the second synchronization pattern CRS) of the synchronization pattern register circuit 90 and bit (34) (LSB of the bit string BS3) of the shift register 10 are each carried out in a manner similar to that described above. As a result, the second synchronization pattern CRS and the bit string BS3 are compared by the same bit sequence, which allows to perform coincidence comparison on the above items.

When the coincidence detection circuit D3 detects that the bit string BS3 coincides with the second synchronization pattern CRS, selector circuit 60 selects the upper bit string HBS3 and outputs the selected column as detection data FD.

Here, the upper bit string HBS3 outputted as detection data FD is not subjected to the bit sequence conversion operation. If the detection data FD is directly inputted to the second flip flop 80, without passing through the output data bit sequence conversion circuit 21, the 1st bit serving as the LSB of the upper bit string HBS3 is inputted to bit (1) of the second flip flop 80, and the $8^{th}$ bit serving as the MSB is inputted to bit (8). Thus, unlike the case of the first embodiment, the bit sequence of the detection data FD to be inputted to the second flip flop 80 is reversed. The output data bit sequence conversion circuit 21 performs a conversion operation to reverse the bit sequence of the detection data FD, and inputs the converted detection data CFD obtained through conversion to the second flip flop 80. Then, the converted detection data CFD is outputted from the second flip flop 80 as 8-bit parallel data PADATA2, in response to the clock signal DSCLK4.

As a result, unlike the scheme described in the first embodiment according to which the bit sequence of the bit strings BS1 through BS8 is converted, in the present embodiment, since it is sufficient to convert only the bit sequence of the second synchronization pattern CRS and of the detection data FD, the data volume to be subjected to the conversion is reduced. This makes it possible to further minimize the circuit size of the synchronization code detection circuit 4a and to save power.

Figure 8:
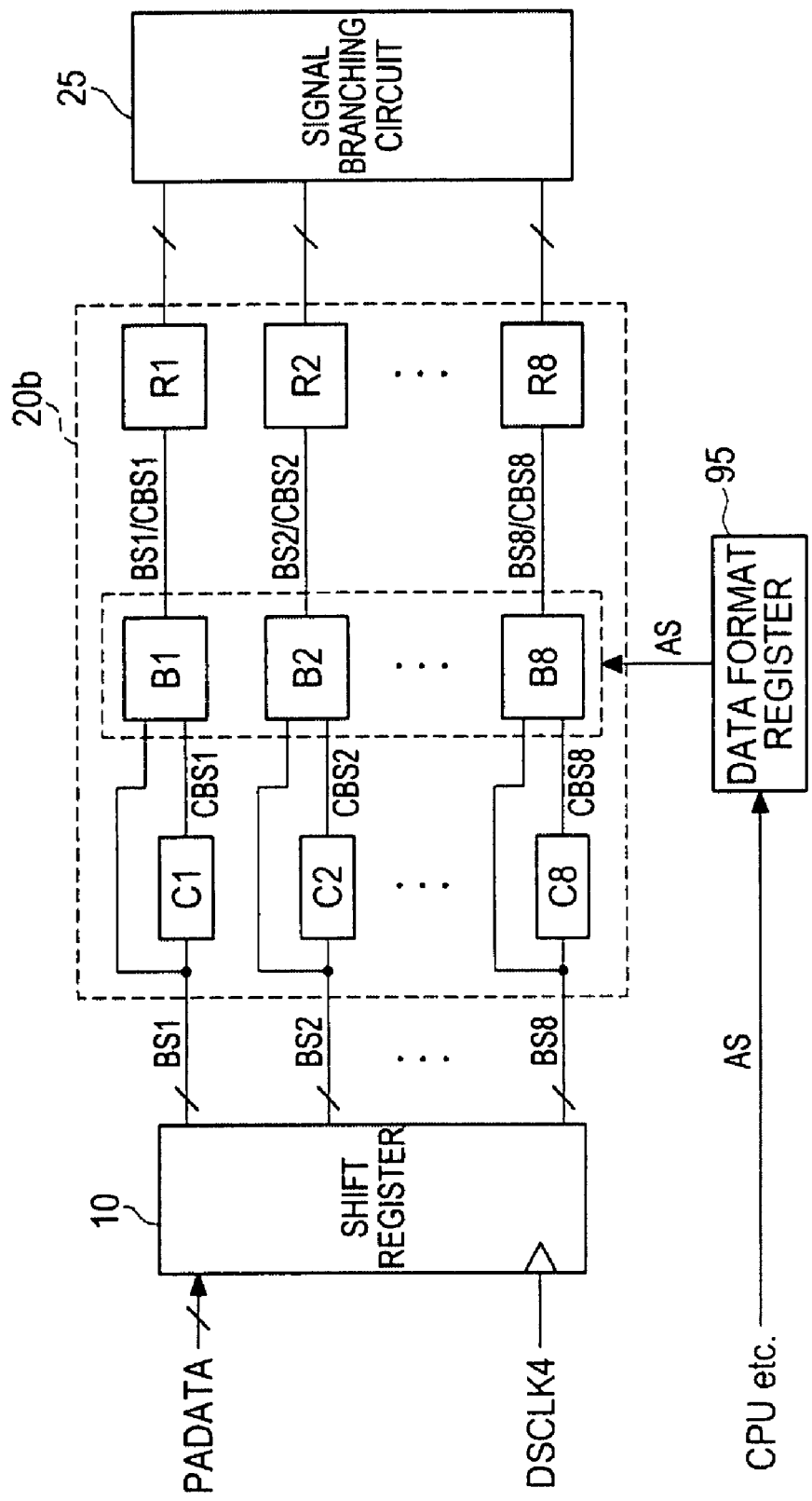
FIG. 8 is a circuit configuration diagram of a bit sequence conversion circuit 20b.

A third embodiment of the present application will be described using FIG. 8. The synchronization code detection circuit according to embodiment 3 is provided with bit sequence conversion circuit 20b and data format register 95, in place of the bit sequence conversion circuit 20 of the first embodiment. The bit sequence conversion circuit 20b is provided with bypass selector circuits B1 through B8 arranged in the connection paths between the conversion parts C1 through CB and the bit string register circuits R1 through R8. The bypass selector circuits B1 through B8 receive the bit strings BS1 through BS8 outputted from the shift register 10, and the converted bit strings CBS1 through CBS8 outputted from the conversion part C1. An annunciation signal AS is inputted from an exterior control device such as a CPU or the like, and held in the data format register 95. The annunciation signal AS serves to give notification as to whether the bit arrangement of the data bit groups in the serial data SEDATA is LSB first or MSB first. The annunciation signal AS outputted from the data format register 95 is outputted to each of the bypass selector circuits B1 through B8. The bypass selector circuits B1 through B8 select either one of the bit strings BS1 through BS8 and the converted bit strings CBS1 through CBS8, in response to the annunciation signal AS, and outputs the result to the bit string register circuits R1 through R8.

If the bit sequence of the data bit groups in the serial data SEDATA is LSB first, the annunciation signal AS indicating that LSB first is inputted from the CPU or the like is inputted to the bypass selector circuits B1 through B8, through the data format register 95. The bypass selector circuits B1 through B8 select the converted bit strings CBS1 through CBS8 in response to the annunciation signal AS, and output the result to the bit string register circuits R1 through R8. As a result, as described in the first embodiment, the serial data receiving circuit 1 converts the bit sequence of the data bit groups constituting the serial data SEDATA from LSB first to MSB first, which allows the bit sequence to be outputted as serial data SEDATA2.

On the other hand, if the bit sequence of the data bit groups in the serial data SEDATA is MSB first, the bypass selector circuits B1 through B8 select the bit strings BS1 through BS8 in response to the annunciation signal AS and outputs these to bit string register circuits R1 through R8. As a result, the serial data receiving circuit 1 outputs the bit sequence of the data bit groups constituting the serial data SEDATA, with the bit sequence maintained as MSB first, as serial data SEDATA2.

As described in the above, in the synchronization code detection circuit according to the third embodiment, the bit sequence of the data bit groups in the serial data SEDATA2 can be set to MSB first, irrespective of whether the bit sequence of the data bit groups in the serial data SEDATA is either LSB first or MSB first.

The bypass selector circuit may be provided in the synchronization code detection circuit 4a (FIG. 7) according to the second embodiment, so as to bypass the output data bit sequence conversion circuit 21. A configuration may be adopted in which if the bit sequence of the data bit groups in the serial data SEDATA is LSB first, the bypass selector circuit selects the converted detection data CFD in response to the annunciation signal AS, and outputs the result to the second flip flop 80, and if the above bit sequence is MSB first, it selects the detection data FD and outputs the result to the second flip flop 80. As a result, it is needless to say that the bit sequence of the data bit groups in the serial data SEDATA2 can be handled as MSB first even in the case the bit sequence of the data bit groups in the serial data SEDATA is LSB first or in the case it is MSB first.

Figure 9:
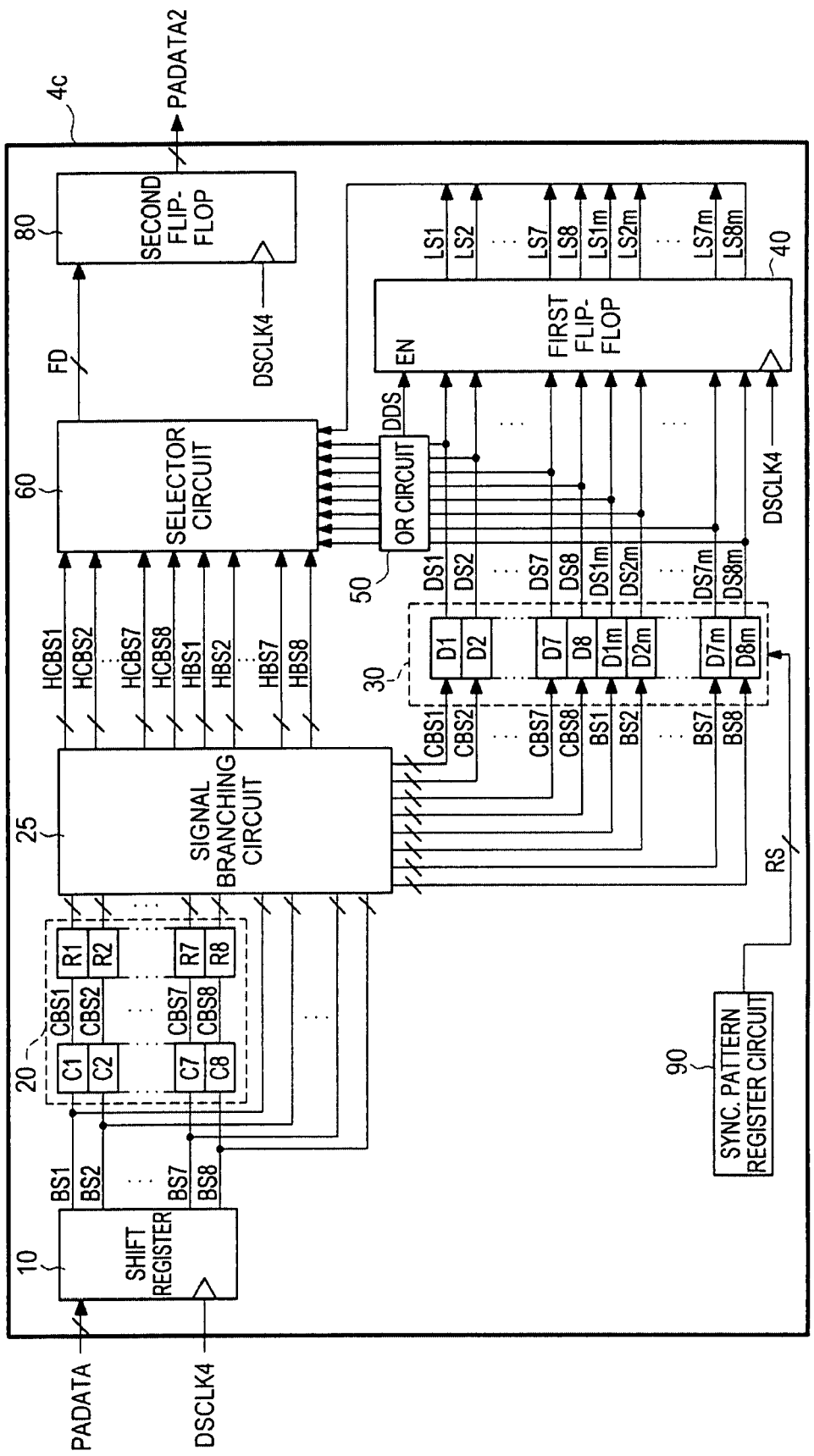
FIG. 9 is a circuit configuration diagram of a synchronization code detection circuit 4c.
Figure 10:
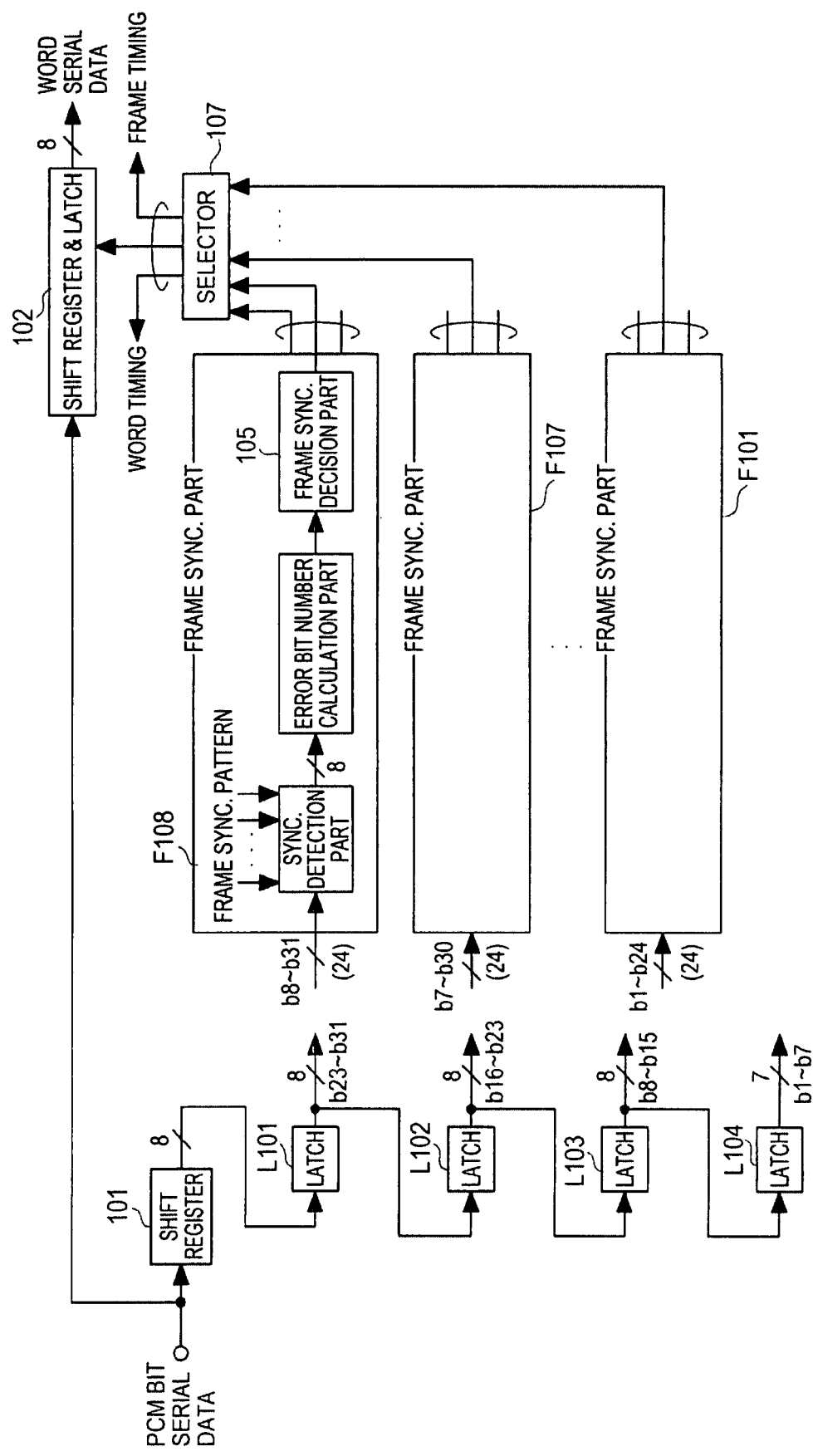
FIG. 10 is a circuit diagram of a conventional serial data receiving device.

A synchronization code detection circuit 4c according to the fourth embodiment of the present application will be described using FIG. 9. The synchronization code detection circuit 4c is a circuit that has two system paths including the path in the case the bit sequence of the data bit groups in the serial data SEDATA is LSB first, and the path in the case the above bit sequence is MSB first. The bit strings BS1 through BS8 outputted from the shift register 10 are inputted to the signal branching circuit 25 after being converted into converted bit strings CBS1 through CBS8 in the bit sequence conversion circuit 20, and are also inputted to the signal branching 25 without being converted in the bit sequence conversion circuit 20. The signal branching circuit 25 outputs the upper bit strings HBS1 through HBS8 which are upper 8-bit bit strings of the bit strings BS1 through BS8, in addition to the upper bit strings HCBS1 through HCBS8 which are upper 8-bit bit strings of the converted bit strings CBS1 through CBS8. The start code detection circuit 30 is provided with the coincidence detection circuits D1m through D8m, in addition to the coincidence detection circuits D1 through D8. The coincidence detection circuits D1 through D8 output detection signals DS1 through DS8, and coincidence detection circuits D1m through D8m output detection signals DS1m through DS8m. The synchronization pattern RS outputted from the synchronization pattern register circuit 90 is inputted to each of the coincidence detection circuits D1 through D8 of the start code detection circuit 30 and the coincidence detection circuits Dim through D8m. Here, the LSB of the synchronization pattern RS is held at bit (1) of the register circuit 90, and the MSB of the synchronization pattern RS is held at bit (32) of the register circuit 90. The first flip flop 40 outputs lock signals LS1 through LS8, and lock signals LS1m through LS8m. The remaining configuration is the same as that of the synchronization code detection circuit 4 according to embodiment 1, and further description thereof is hereby omitted.

The operation in the case that coincidence is detected by the coincidence detection circuits D3 or D3m will be described as an example. The coincidence detection circuit D3 receives the converted bit string CBS3 and the synchronization pattern RS. To perform coincidence detection in the coincidence detection circuit D3, the bit sequences of the converted bit strings CBS3 and the synchronization pattern RS must be the same. Similarly, the coincidence detection circuit D3m receives the bit string BS3 and the synchronization pattern RS. To perform coincidence detection in the coincidence detection circuit D3m, the bit sequences of the bit string BS3 and the synchronization pattern RS must be the same.

Next, the case in which the bit sequence of the data bit groups in the inputted serial data SEDATA is LSB first will be described. In this case, the LSB of the converted bit string CBS3 corresponds to bit (1) of the bit string register circuit R3, and the MSB of the converted bit string CBS3 corresponds to bit (32) of the bit string register circuit R3, as it was described in the first embodiment. On the other hand, the LSB of the bit string BS3 corresponds to bit (34) of the shift register 10, and the MSB of the bit string BS3 corresponds to bit (3) of the shift register 10. As a result, the bit sequences of the converted bit string CBS3 and the synchronization pattern RS are the same. Thus, coincidence detection is carried out in the coincidence detection circuit D3 to output a high level detection signal DS3. Then, the selector circuit 60 selects the upper bit string HCBS3 in response to the detection signal DS3, and outputs this column as detection data FD.

On the other hand, the case in which the bit sequence of the data bit groups in the inputted serial data SEDATA is MSB first will be described. In this case, the LSB of the bit string BS3 corresponds to bit (3) of the shift register 10, and the MSB of the bit string BS3 corresponds to bit (34) of the shift register 10, as it was described in the second embodiment. On the other hand, the LSB of the converted bit string CBS3 corresponds to bit (32) of the bit string register circuit R3, and the MSB of the converted bit string CBS3 corresponds to bit (1) of the bit string register circuit R3. As a result, the bit sequences of the bit string BS3 and the synchronization pattern RS become the same. Coincidence detection is carried out in the coincidence detection circuit D3m to output a high level detection signal DS3m. Then, the selector circuit 60 selects the upper bit string HBS3 in response to the detection signal DS3m, and outputs this signal as detection data FD.

As a result, the bit sequence of the data bit groups in the serial data SEDATA2 can be reliably handled as MSB first by the synchronization code detection circuit 4c, even in the event the bit sequence of the data bit groups in the inputted serial data SEDATA is either LSB first or MSB first.

The embodiment of the present application is not limited to the above-described embodiments, and needless to say, various improvements and modifications thereof can be performed without departing from the scope of the embodiment. In the present embodiments, a description was given in which the output data of the serial data receiving circuit 1 is the serial data SEDATA2 which was converted in the parallel-to-serial conversion circuit 5, however, the embodiments are not limited to this. Needless to say, the parallel data PADATA2 may be used as the output data of the serial data receiving circuit 1.

Although in the first embodiment the conversion parts C1 through C8 are respectively provided in the connection paths between the shift register 10 and the bit string register circuits R1 through R8, the embodiment is not limited to this. Needless to say, the conversion parts C1 through C8 may also be provided in the connection paths between the bit string register circuits R1 through R8 and the signal branching circuit 25.

Although in the present embodiments the serial data SEDATA is transmitted using the LVDS scheme, the embodiments are not limited to this. Needless to say, the embodiment of the present application can be applied to serial data having any type of format, as long as the serial data is transmitted in the format start code→valid data→end code.

Although in the present embodiments the serial data SEDATA is serially transmitted in successive 8-bit data bit groups, the embodiments are not limited to this. Needles to say, the embodiment of the present application can be applied to data bit groups constituted of 16-bit word units, or 32-bit long word units, in addition to 8-bit byte units.

Although in the present embodiments the shift register 10 is a 40-bit shift register, the embodiments are not limited to this. Since it is sufficient to obtain 8 different bit strings BS1 through BS8 consisting of 32 bits in which bit (1) to bit (8) of the shift register 10 each represent start points, and bit (32) through bit (39) each represent endpoints, the shift register 10 may be a shift register constituted of at least 39 bits.

The start code detection circuit 30 is an example of a comparison circuit, the conversion parts C1 through C8 are examples of conversion circuits, and bypass selector circuits B1 through B8 are examples of switch circuits, respectively.

According to the serial data receiving circuit and the serial data receiving method of the present application, it is possible to provide a serial data receiving circuit and a serial data receiving method capable of detecting a frame synchronization pattern from serial data transmitted serially in successive data bit groups having an LSB first bit sequence, and performing interconversion on the bit sequence of the data bit groups in the serial data transmitted serially in successive data bit groups, between the LSB first and MSB first.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A serial data receiving circuit detecting a k-bit (k being a natural number) synchronization pattern from serial data transmitted serially in successive m-bit (m being a natural number) data bit groups having an LSB first bit sequence or an MSB first bit sequence, and outputting the data bit groups that were correctly partitioned into m bits, the serial data receiving circuit comprising:

a shift register circuit capturing the serial data consisting of at least (m+k−1) bits and outputting m different bit strings consisting of k bits, with bits from bit 1 to bit m each being handled as start points, every time the shift register circuit receives the serial data consisting of m bits;

a comparison circuit performing a coincidence detection operation on each of the bit strings to detect coincidence with the synchronization pattern;

a selector circuit that selecting and outputting the bit strings which were subjected to the coincidence detection operation in the comparison circuit; and a conversion circuit provided in a connection path between the shift register circuit and the comparison circuit or in an output path of the selector circuit, the conversion circuit performing a conversion operation in which a bit sequence of the bit strings is reversed every m-bits starting from a head bit.

2. The serial data receiving circuit according to claim 1 further comprising a parallel-to-serial conversion circuit carrying out parallel-to-serial conversion with respect to the bit strings inputted from the selector circuit, based on a bit rate of the serial data.

3. The serial data receiving circuit according to claim 1 further comprising a switch circuit by-passing the conversion circuit when a bit sequence of the serial data inputted to the serial data receiving circuit is identical to a bit sequence of output serial data outputted from the parallel-to-serial conversion circuit.

4. The serial data receiving circuit according to claim 1,
wherein the conversion circuit is provided in a connection path between the shift register circuit and the comparison circuit;
the synchronization pattern corresponds to converted bit strings converted by the conversion circuit; and
the comparison circuit performs a coincidence detection operation on each of the converted bit strings to detect coincidence with the synchronization pattern.

5. The serial data receiving circuit according to claim 4, wherein the conversion circuit serves as wiring that connects the shift register circuit with the comparison circuit.

6. The serial data receiving circuit according to claim 4 further comprising a bit string register circuit provided in a connection path between the conversion circuit and the comparison circuit, the bit string register circuit capturing converted bit strings outputted from the conversion circuit.

7. The serial data receiving circuit according to claim 1,
wherein the conversion circuit is provided in an output path of the selector circuit;
the synchronization pattern corresponds to the bit strings, and
the comparison circuit performs a coincidence detection operation on each of the bit strings to detect coincidence with the synchronization pattern.

8. The serial data receiving circuit according to claim 1,
wherein the comparison circuit receives each one of the bit strings, and each one of converted bit strings on which a conversion operation was carried out in the conversion circuit; and
the comparison circuit performs a coincidence detection operation on a predetermined one of the bit strings and the converted bit strings, to detect coincidence with the synchronization pattern.

9. The serial data receiving circuit according to claim 1 further comprising a storage part provided in a connection path between the comparison circuit and the selector circuit, the storage part storing the bit strings on which the coincidence detection operation was performed and notifying the selector circuit of the bit strings stored therein.

10. The serial data receiving circuit according to claim 1, wherein if the serial data inputted to the serial data receiving circuit has an LSB first bit sequence, the data bit groups outputted from the serial data receiving circuit have an MSB first bit sequence and are outputted serially; and if the serial data inputted into the serial data receiving circuit has an MSB first bit sequence, the data bit groups outputted from the serial data receiving circuit have an LSB first bit sequence and are outputted serially.

11. A serial data receiving device detecting a k-bit (k being a natural number) synchronization pattern from serial data transmitted serially in successive m-bit (m being a natural number) data bit groups having an LSB first bit sequence or an MSB first bit sequence, and outputting the data bit groups that were correctly partitioned into m bits, the serial data receiving device comprising:

a shift register circuit capturing the serial data consisting of at least (m+k−1) bits and outputting m different bit strings consisting of k bits, with bits from bit 1 to bit m each being handled as start points, every time the shift register circuit receives the serial data consisting of m bits;

a comparison circuit performing a coincidence detection operation on each of the bit strings to detect coincidence with the synchronization pattern;

a selector circuit selecting and outputting the bit strings which were subjected to the coincidence detection operation in the comparison circuit; and a conversion circuit provided in a connection path between the shift register circuit and the comparison circuit or in an output path of the selector circuit, the conversion circuit performing a conversion operation in which a bit sequence of the bit strings is reversed every m-bits from a head bit.

12. A serial data receiving method for detecting a k-bit (k being a natural number) synchronization pattern from serial data transmitted serially in successive m-bit (m being a natural number) data bit groups having an LSB first bit sequence or an MSB first bit sequence, and outputs the data bit groups that were correctly partitioned into m bits, the serial data receiving method comprising the steps of:

capturing the serial data consisting of at least (m+k−1) bits and outputting m different bit strings consisting of k bits, with bits from bit 1 to bit m each being handled as start points, every time the serial data consisting of m bits is received;

performing a coincidence detection operation on each of the bit strings to detect coincidence with the synchronization pattern;

selecting and outputting the bit strings which were subjected to the coincidence detection operation in the step of performing the coincidence detection operation; and performing a conversion operation to reverse a bit sequence of the bit strings every m-bits starting from a head bit.

* * * * *